United States Patent
Tokuda et al.

(10) Patent No.: US 9,919,341 B2
(45) Date of Patent: Mar. 20, 2018

(54) ULTRASONIC MOTOR AND SURVEYING INSTRUMENT

(71) Applicant: TOPCON Corporation, Tokyo-to (JP)

(72) Inventors: Yoshihiko Tokuda, Tokyo-to (JP); Satoshi Nakamura, Tokyo-to (JP); Yosuke Okudaira, Tokyo-to (JP)

(73) Assignee: TOPCON Corporation, Tokyo-to (JP)

(*) Notice: Subject to any disclaimer, the term of this patent is extended or adjusted under 35 U.S.C. 154(b) by 0 days.

(21) Appl. No.: 15/402,626

(22) Filed: Jan. 10, 2017

(65) Prior Publication Data

US 2017/0203332 A1 Jul. 20, 2017

(30) Foreign Application Priority Data

Jan. 18, 2016 (JP) ................... 2016-007035

(51) Int. Cl.
*B06B 1/06* (2006.01)
*G01C 1/02* (2006.01)
(Continued)

(52) U.S. Cl.
CPC .................. *B06B 1/06* (2013.01); *G01C 1/02* (2013.01); *G01S 7/4813* (2013.01); *G02B 23/16* (2013.01); *H01L 41/09* (2013.01); *H02N 2/10* (2013.01)

(58) Field of Classification Search
CPC .. B06B 1/06; G01C 1/02; G01C 15/00; G01S 7/4813; G02B 23/16; G02B 2027/011;
(Continued)

(56) References Cited

U.S. PATENT DOCUMENTS

| 5,475,930 A | 12/1995 | Kimura |
| 2001/0013740 A1* | 8/2001 | Fukui ................... H02N 2/166 310/323.04 |

(Continued)

FOREIGN PATENT DOCUMENTS

| EP | 2759801 A2 | 7/2014 |
| JP | 2-303378 A | 12/1990 |

(Continued)

OTHER PUBLICATIONS

European communication dated Apr. 25, 2017 in co-pending European patent application No. 17151866.5.

*Primary Examiner* — Frank Font
(74) *Attorney, Agent, or Firm* — Nields, Lemack & Frame, LLC

(57) ABSTRACT

The invention provides an ultrasonic motor, which is an ultrasonic motor provided on a shaft end of a rotation shaft. An output shaft of the ultrasonic motor is connected to the rotation shaft, a stator is rotatably provided on the output shaft, a rotor is fixed to the rotation shaft, a vibration generating component for generating an ultrasonic vibration is provided on either one of the rotor or the stator. A whirl-stop unit is provided between the stator and a fixed side for supporting the rotation shaft: the whirl-stop unit has a joint holder provided on the fixed side and a connection element provided on the stator: the joint holder has a ball holder for pressing a metal ball to the connection element in a circumferential direction and a connection pin holding the connection element between the ball holder and the connection pin, spanning over the joint holder and capable of tilting.

6 Claims, 3 Drawing Sheets

(51) Int. Cl.
  *G01S 7/481* (2006.01)
  *H01L 41/09* (2006.01)
  *G02B 23/16* (2006.01)
  *H02N 2/10* (2006.01)

(58) Field of Classification Search
  CPC ...... G03B 21/147; G03B 21/208; G12B 9/00;
   G12B 9/08; H02N 2/00; H02N 2/16
  USPC ................ 359/429; 33/290, 299; 310/313 R,
   310/313 B, 323.03, 323.04, 323.06
  See application file for complete search history.

(56) References Cited

U.S. PATENT DOCUMENTS

| | | | |
|---|---|---|---|
| 2007/0057598 A1* | 3/2007 | Budinger | H02N 2/0095 310/323.01 |
| 2010/0180456 A1 | 7/2010 | Laabs et al. | |
| 2014/0196293 A1* | 7/2014 | Kodaira | G01C 15/002 33/227 |
| 2016/0145997 A1* | 5/2016 | Van Steenwyk | E21B 47/022 33/302 |
| 2016/0204335 A1* | 7/2016 | Oshima | H01L 41/1871 347/68 |
| 2017/0205229 A1* | 7/2017 | Tokuda | G01C 3/04 |
| 2017/0207384 A1 | 7/2017 | Tokuda et al. | |

FOREIGN PATENT DOCUMENTS

| | | |
|---|---|---|
| JP | 11-311517 A | 11/1999 |
| JP | 2003-199370 A | 7/2003 |
| JP | 2014-137299 A | 7/2014 |

\* cited by examiner

ULTRASONIC MOTOR AND SURVEYING INSTRUMENT

BACKGROUND OF THE INVENTION

The present invention relates to an ultrasonic motor with high accuracy and a simple structure and a surveying instrument including the ultrasonic motor.

A surveying instrument, e.g., a total station has a telescope unit for sighting a measuring point. The telescope unit is supported by a frame unit rotatably in a vertical direction, and further, the frame unit is supported rotatably in a horizontal direction by a base unit. Further, the total station includes a motor for rotating the telescope unit and a motor for rotating the frame unit.

Further, use of an ultrasonic motor as a motor has been proposed recently. The ultrasonic motor does not require a speed reducer or the like but is directly connected to a rotation shaft (driven shaft) of an object to be driven. Therefore, the ultrasonic motor has merits that an object to be driven can be directly driven, there is no error caused by a backlash or the like, and further, a structure of a driving unit can be simplified.

On the other hand, in an instrument requiring high accuracy as in the surveying instrument, in a case where a driven shaft and an ultrasonic motor are directly connected to each other, a run out of the ultrasonic motor itself or an eccentricity caused by an assembling error when the driven shaft and the ultrasonic motor are directly connected to each other gives an influence on a rotation of the driven shaft. Therefore, there is a fear that a rotational accuracy of the driven shaft deteriorates and in turn a deterioration of a measurement accuracy is incurred.

SUMMARY OF THE INVENTION

It is an object of the present invention to provide an ultrasonic motor in which an output shaft and a rotation shaft of the ultrasonic motor are directly connected to each other and further, from which an influence of an eccentricity between the output shaft and the rotation shaft is removed and a surveying instrument including the ultrasonic motor.

To attain the object as described above, an ultrasonic motor according to the present invention, which is an ultrasonic motor provided on a shaft end of a rotation shaft supported rotatably, wherein an output shaft of the ultrasonic motor is connected to the rotation shaft, a stator is rotatably provided on the output shaft, a rotor is fixed to the rotation shaft, a vibration generating component for generating an ultrasonic vibration is provided on either one of the rotor or the stator, the rotor and the stator are constituted to make a relative rotation by the ultrasonic vibration, a whirl-stop unit is provided between the stator and a fixed side for supporting the rotation shaft, wherein the whirl-stop unit has a joint holder provided on the fixed side and a connection element provided on the stator, wherein the joint holder has a ball holder for pressing a metal ball to the connection element by a compression spring in a circumferential direction and a connection pin holding the connection element between the ball holder and the connection pin, spanning over the joint holder and capable of tilting and wherein the whirl-stop unit restricts a displacement of the connection element in a rotating direction and absorbs a displacement in a radial direction between the joint holder and the connection element by tilting of the connection pin.

Further, in the ultrasonic motor according to the present invention, the rotor has a driving disk, the vibration generating component in a ring shape is provided on an outer circumferential portion of the driving disk, the stator has an intermediate disk and a fixed disk, the intermediate disk is in close contact with the vibration generating component via a friction torque T1, the fixed disk is in close contact with the intermediate disk via a friction torque T2 smaller than the friction torque T1, and the whirl-stop unit is provided on the fixed disk.

Further, in the ultrasonic motor according to the present invention, the rotor has an intermediate disk, the intermediate disk is in close contact with the output shaft via a friction torque T2, the stator has a driving disk and a fixed disk fixed to the driving disk, the driving disk has the vibration generating component in a ring shape on an outer circumferential portion, the vibration generating component is in close contact with the intermediate disk via a friction torque T1 larger than the friction torque T2, and the whirl-stop unit is provided on the fixed disk.

Furthermore, a surveying instrument according to the present invention comprises a frame unit provided on a leveling unit, capable of horizontal rotation via a horizontal shaft and a telescope unit provided on the frame unit rotatably in a vertical direction via a vertical shaft, wherein an ultrasonic motor is provided at least on either one of the horizontal shaft or the vertical shaft.

According to the present invention, an ultrasonic motor, which is an ultrasonic motor provided on a shaft end of a rotation shaft supported rotatably, wherein an output shaft of the ultrasonic motor is connected to the rotation shaft, a stator is rotatably provided on the output shaft, a rotor is fixed to the rotation shaft, a vibration generating component for generating an ultrasonic vibration is provided on either one of the rotor or the stator, the rotor and the stator are constituted to make a relative rotation by the ultrasonic vibration, a whirl-stop unit is provided between the stator and a fixed side for supporting the rotation shaft, wherein the whirl-stop unit has a joint holder provided on the fixed side and a connection element provided on the stator, wherein the joint holder has a ball holder for pressing a metal ball to the connection element by a compression spring in a circumferential direction and a connection pin holding the connection element between the ball holder and the connection pin, spanning over the joint holder and capable of tilting and wherein the whirl-stop unit restricts a displacement of the connection element in a rotating direction and absorbs a displacement in a radial direction between the joint holder and the connection element by tilting of the connection pin. As a result, the output shaft and the rotation shaft of the ultrasonic motor are directly connected to each other and a simple structure can be achieved, and further, an influence of an eccentricity between the output shaft and the rotation shaft is removed.

Further, according to the present invention, a surveying instrument comprises a frame unit provided on a leveling unit, capable of horizontal rotation via a horizontal shaft and a telescope unit provided on the frame unit rotatably in a vertical direction via a vertical shaft, wherein an ultrasonic motor is provided at least on either one of the horizontal shaft or the vertical shaft. As a result, by directly driving the rotation shaft by the ultrasonic motor, the structure is simplified, and there is no error caused by a backlash or the like, and occurrence of an error over time can be suppressed.

DETAILED DESCRIPTION OF THE PREFERRED EMBODIMENTS

A description will be given below on an embodiment of the present invention by referring to the attached drawings.

Figure 1:
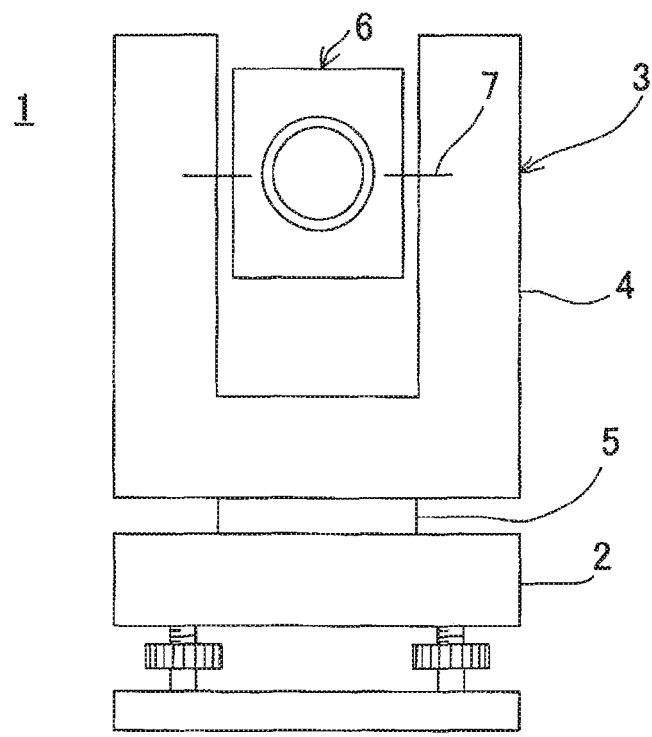
FIG. 1 is an entire view of a surveying instrument according to an embodiment of the present invention.

FIG. 1 is an entire view showing a surveying instrument 1 according to the present embodiment and in FIG. 1, reference numeral 2 denotes a leveling unit, and reference numeral 3 denotes a surveying instrument main body.

The surveying instrument main body 3 is installed on the leveling unit 2, and the surveying instrument main body 3 is configured to be leveled to a horizontal state by the leveling unit 2.

The surveying instrument main body 3 has a frame unit 4, a horizontal rotation driving unit 5 and a telescope unit 6. The horizontal rotation driving unit 5 is located on a lower end portion of the frame unit 4 and is mounted on the leveling unit 2 and supports the frame unit 4 capable of horizontal rotation.

On the frame unit 4, the telescope unit 6 is provided rotatably around a horizontal axis 7 as the center. The telescope unit 6 incorporates a distance measuring unit (not shown), and the distance measuring unit projects a modulated laser beam or a pulsed light as a distance measuring light toward an object to be measured (not shown), receives a reflected light from the object to be measured and performs a distance measurement.

Further, a horizontal rotation angle of the frame unit 4 and a vertical rotation angle of the telescope unit 6 are detected by a horizontal angle encoder (not shown) and a vertical angle encoder (not shown), respectively.

Based on a distance measuring result, a horizontal angle as detected and a vertical angle as detected, three-dimensional data of a measuring point or an object to be measured is measured.

Next, by referring to FIG. 2, a detailed description will be given on the horizontal rotation driving unit 5.

A motor casing 11 has a rigidity and a strength as required and is liquid-tightly constituted by an upper case 12 and a lower case 13. Inside the motor casing 11, a horizontal motor (an ultrasonic motor) 14 by ultrasonic wave driving is accommodated. The lower case 13 is mounted on the leveling unit 2. Here, the motor casing 11 functions as a case for accommodating the horizontal motor 14 and also functions as a structural member for supporting the frame unit 4.

A bearing block 15 extending upward is provided on an upper surface of the upper case 12, and a horizontal shaft 17 penetrating up and down the bearing block 15 is rotatably provided. On an upper end of the horizontal shaft 17, a flange 18 is formed, and the frame unit 4 is fixed on the flange 18.

Between the flange 18 and an upper end of the bearing block 15, a thrust bearing 16 is provided, and by means of the thrust bearing 16, a vertical load of the surveying instrument main body 3 is supported.

On a lower end of the horizontal shaft 17, a connection flange 19 is fixed. Further, on the connection flange 19, the horizontal motor 14 is fixed by a bolt 21. Further, the horizontal motor 14 can be removed from the connection flange 19 (that is, the horizontal shaft 17) by removing the bolt 21.

Further, a description will be given on the horizontal motor 14.

On an upper end of an output shaft 22 of the horizontal motor 14, an output flange 23 is formed. On a lower surface of the output flange 23, a driving disk 24 is fixed. A diameter of the driving disk 24 is larger than the output flange 23, and a vibration generating component 25 with a ring shape is provided on an outer circumferential portion of the driving disk 24 extended from the output flange 23.

On a lower surface of the vibration generating component 25, comb teeth are formed over a total circumference. On an upper surface of the vibration generating component 25, a piezoelectric ceramic (a piezoelectric element) 26 with a thin-plate ring shape is fixed in close contact concentrically with the driving disk 24.

On a lower side of the driving disk 24, an intermediate disk 27 is provided. The intermediate disk 27 is rotatably provided on the output shaft 22 and the intermediate disk 27 is capable of displacement in an axial direction. On an outer circumferential portion of the intermediate disk 27, a ring-shaped rib 27a is formed, and the rib 27a is in close contact with a lower surface of the vibration generating component 25 via a first friction sheet 28.

A fixed disk 32 is rotatably fitted with the output shaft 22 via a bearing 31 and further, the fixed disk 32 is capable of displacement in an axial direction. Between the fixed disk 32 and the intermediate disk 27, a second friction sheet 33 is interposed.

On the lower end portion of the output shaft 22, a fixing nut 34 is screwed up, and between the fixing nut 34 and the bearing 31, a compression spring 35 is provided. The compression spring 35 is provided in a compressed state so as to act a required pressing force between the vibration generating component 25 and the rib 27a and between the intermediate disk 27 and the fixed disk 32.

Further, by the pressing force applied by the compression spring 35, a relationship between a friction torque T1, which is generated between the vibration generating component 25 and the intermediate disk 27, and a friction torque T2, which is generated between the intermediate disk 27 and the fixed disk 32, is T1>T2. Further, T2 is larger than a driving torque required for the horizontal motor 14 during a normal operation.

By supplying power from a power supply unit (not shown) provided inside the frame unit 4 to the piezoelectric ceramic 26, the comb teeth are ultrasonically vibrated, and it is so arranged that a relative rotation is generated between the rib 27a and the vibration generating component 25.

Further, between the intermediate disk 27 and the fixed disk 32, a friction force acts, and the intermediate disk 27 and the fixed disk 32 are rotatable with respect to the output shaft 22 and hence, the intermediate disk 27 and the fixed disk 32 are rotated integrally. Further, as described later, between the fixed disk 32 and the lower case 13 (that is, the fixing unit), a whirl-stop unit 45 is provided, and a rotation of the fixed disk 32 is restricted.

Therefore, the intermediate disk 27 and the fixed disk 32 function as a stator, and the output shaft 22 (that is, the output flange 23) functions as a rotor. By supplying power to the piezoelectric ceramic 26 and by controlling the power supplying, the output flange 23 is rotated in a required direction and at a required rotation speed.

The output flange 23 functions as an output end of the horizontal motor 14 and also has a function as a joint for connecting the horizontal motor 14 to the horizontal shaft 17. Further, when the output flange 23 and the connection flange 19 are connected, the horizontal motor 14 is mounted on a lower end of the horizontal shaft 17 and comes into a state supported by the horizontal shaft 17.

Figure 3:
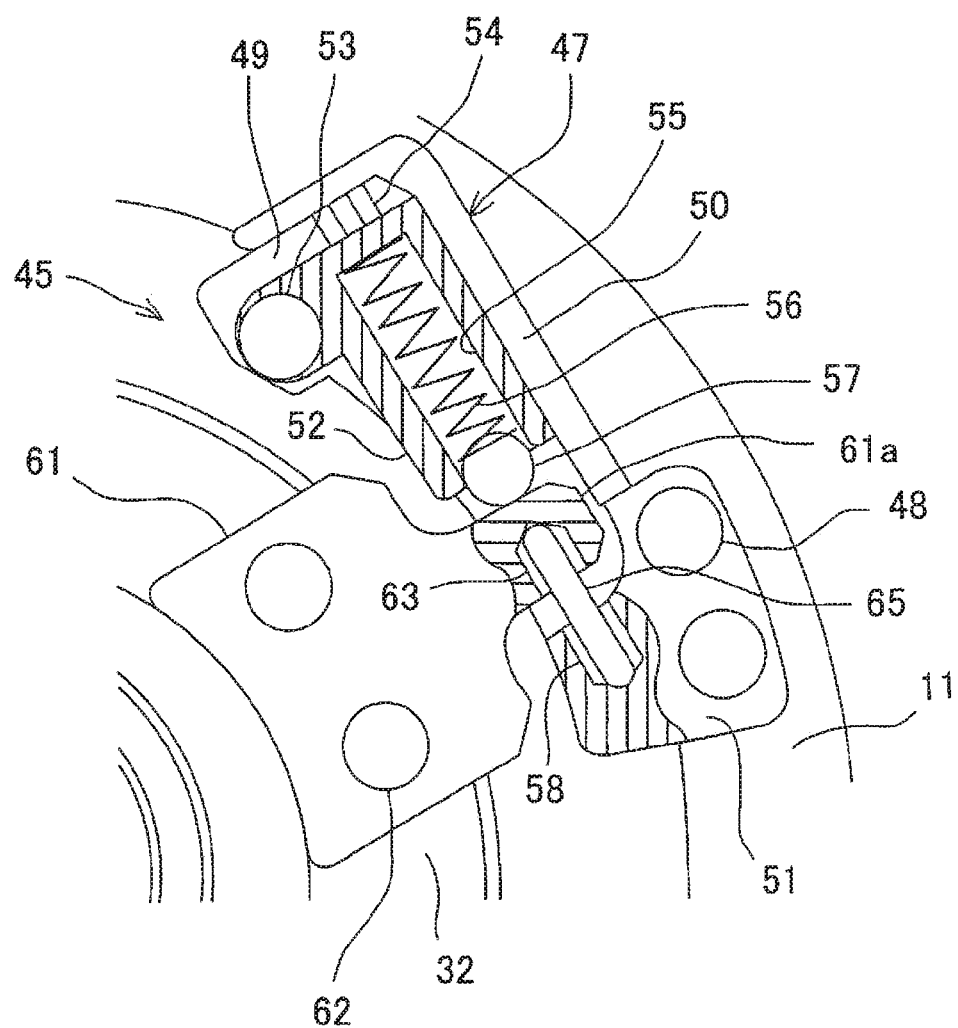
FIG. 3 is a partial cross-sectional views of a whirl-stop unit included in the horizontal rotation driving unit.

Next, by referring to FIG. 3, a description will be given on the whirl-stop unit 45.

As described above, the horizontal motor 14 is mounted on the lower end of the horizontal shaft 17, and a relative rotation is possible between the output flange 23 and the intermediate disk 27, the fixed disk 32. However, in order to obtain a rotating force from the output shaft 22, the intermediate disk 27 and the fixed disk 32 need to be fixed.

The whirl-stop unit 45 connects the fixed disk 32 and the motor casing 11 (in figure in FIG. 2, the upper case 12) to each other and restricts a rotation of the fixed disk 32.

The whirl-stop unit 45 has a joint holder 47 and the joint holder 47 is mounted on the motor casing 11 by a bolt 48. The joint holder 47 is manufactured by machining, die-casting or the like and has a rigidity and a strength as required.

Further, on the joint holder 47, a recessed portion 49 extending in a tangential direction of the motor casing 11 (a tangential direction of a circle around an axis of the output shaft 22 as the center) is formed. The recessed portion 49 is surrounded by an L-shaped brim portion 50 as positioned on an outer circumferential side and a thick base portion 51 as positioned on a base side (lower side in FIG. 3) of the recessed portion 49 in three sides, and is open in a center side.

To the recessed portion 49, a ball holder 52 with an L-shaped outer shape is fixed by a bolt 53 at one spot. Further, the ball holder 52 comes into contact with the brim portion 50. Further, the ball holder 52 is capable of positional adjustment by a pushing screw 54.

In the ball holder 52, a cylindrical hole 55 with an axis in a tangential direction is drilled, and in the cylindrical hole 55, a compression spring 56 is accommodated in a compressed state. Further, at a forward end of the compression spring 56, a metal ball or preferably a steel ball 57 is provided.

In the base portion 51, a pin accommodating hole 58 is drilled so as to be concentric with the cylindrical hole 55, and a hole bottom of the pin accommodating hole 58 is made to be a circular cone. In the pin accommodating hole 58, a connection pin 65 is inserted. Both ends of the connection pin 65 are formed in a spherical shape.

A diameter of the pin accommodating hole 58 is larger than a diameter of the connection pin 65, and the connection pin 65 is capable of tilting around a base end as the center in a state where the base end is fitted with the circular cone.

To the fixed disk 32, a connection plate 61 is fixed by a bolt 62. The connection plate 61 is manufactured by machining, die-casting or the like and has a rigidity and a strength as required.

In the connection plate 61, a connection element 61*a* is provided to protrude at a forward end, and the connection element 61*a* is interposed between the ball holder 52 and the base portion 51.

Further, in the connection element 61*a*, a pin receiving hole 63 is drilled so as to be concentric with the pin accommodating hole 58. A hole bottom of the pin receiving hole 63 is made to be a circular cone.

In the pin receiving hole 63, a forward end portion of the connection pin 65 is inserted, and the connection pin 65 is provided by spanning between the pin accommodating hole 58 and the pin receiving hole 63.

With a surface on a side opposite to the pin receiving hole 63 of the connection element 61*a*, the steel ball 57 comes into contact.

On the surface where the steel ball 57 contacts, a pressing force by the compression spring 56 acts in a tangential direction (a circumferential direction), and a pressing reaction force from the connection pin 65 acts on a hole bottom of the pin receiving hole 63. Further, by a reaction of the compression spring 56, the ball holder 52 is given a rotating force in a counterclockwise direction (in FIG. 3), and the ball holder 52 is brought into close contact with the brim portion 50 and an attitude is fixed.

Therefore, a position in a circumferential direction of the connection plate 61 is determined by the base portion 51 via the connection pin 65. Further, in a case where the connection plate 61 is displaced in a radial direction with respect to the joint, holder 47, the steel ball 57 slides against the connection plate 61, and the connection pin 65 tilts, and a displacement of the connection plate 61 is absorbed.

Thus, the whirl-stop unit 45 restricts a rotation of the fixed disk 32 and further, if the output shaft 22 is eccentric with respect to the horizontal shaft 17, a rotational deviation caused by an eccentricity is absorbed.

A description will be given below on a horizontal rotation driving by the horizontal motor 14.

When a voltage is applied to the piezoelectric ceramic 26, the comb teeth are ultrasonically vibrated and relatively rotated between the intermediate disk 27 and the driving disk 24.

Since the intermediate disk 27 is fixed to the motor casing 11 via the fixed disk 32 and the whirl-stop unit 45, the output shaft 22, that is, the output flange 23 is rotated.

A rotating force of the output shaft 22 is transmitted to the horizontal shaft 17 via the output flange 23, and the frame unit 4 is horizontally rotated.

Even in a case where an error is generated by mounting of the output flange 23 to the connection flange 19 and the output shaft 22 becomes eccentric with respect to the horizontal shaft 17, as described above, the eccentricity is absorbed by the whirl-stop unit 45, and the eccentricity does not influence a rotation of the horizontal shaft 17. Further, even if the horizontal motor 14 itself has a run out, the run out is absorbed by the whirl-stop unit 45, and the error of the horizontal motor 14 itself does not influence a rotational accuracy of the horizontal shaft 17.

That is to say, according to the present embodiment, there is no need to carry out with high accuracy a mounting of the horizontal motor 14 to the horizontal shaft 17.

Further, since the horizontal motor 14 and the horizontal shaft 17 are directly connected to each other, a backlash or the like is not interposed in a power transmission path, power can be transmitted with high accuracy and a deterioration of accuracy over time does not occur.

Next, in a case where an excessive load is acted on the output shaft 22 during driving of the horizontal motor 14, e.g., in a case where the surveying instrument main body 3 interferes with a foreign object and a rotation of the surveying instrument main body is restricted, since a friction torque T2 between the intermediate disk 27 and the fixed disk 32 is set smaller than a friction torque T1 between the driving disk 24 and the intermediate disk 27, a slip is generated between the intermediate disk 27 and the fixed disk 32, and only the intermediate disk 27 is rotated. That is to say, the horizontal motor 14 itself has a safety function against an overload.

Therefore, such a situation that an excessive load is applied to the horizontal motor 14 and the horizontal motor 14 is prevented from being damaged. A restriction of the surveying instrument main body 3 is detected by the horizontal angle encoder (not shown), and a driving of the horizontal motor 14 is stopped.

Further, even if the surveying instrument 1 is in a halt state, a stop state of the surveying instrument main body 3 is maintained by a friction torque of the horizontal motor 14, and by giving a lager rotating force than the friction torque T2 between the intermediate disk 27 and the fixed disk 32, the frame unit 4 can be rotated in a required direction.

Figure 4:
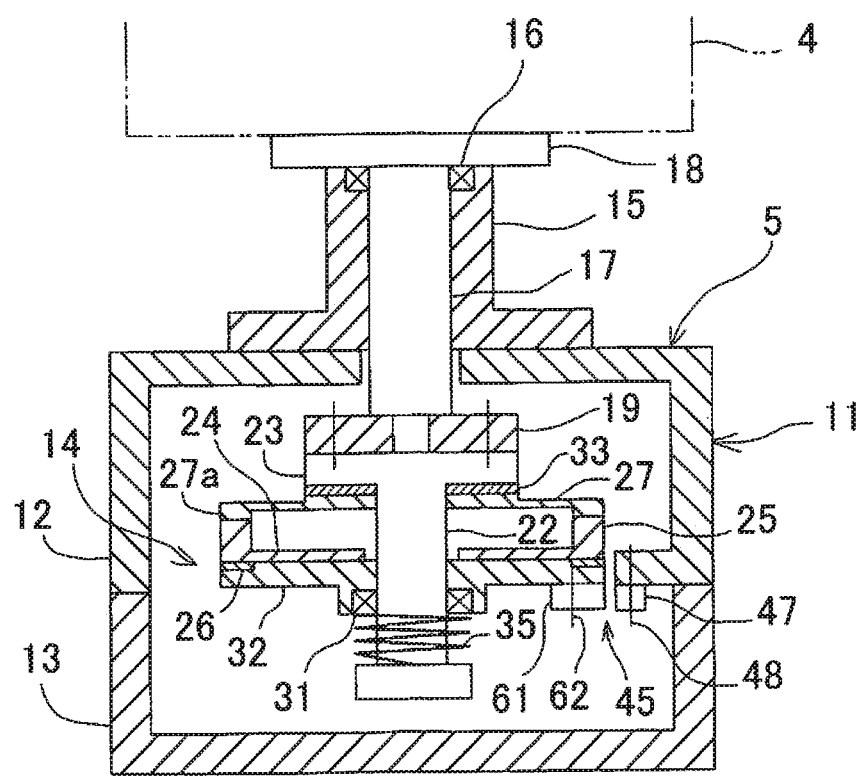
FIG. 4 is a cross-sectional view of a horizontal rotation driving unit of a surveying instrument according to another embodiment of the present invention.

By referring to FIG. 4, a description will be given on another embodiment.

Figure 2:
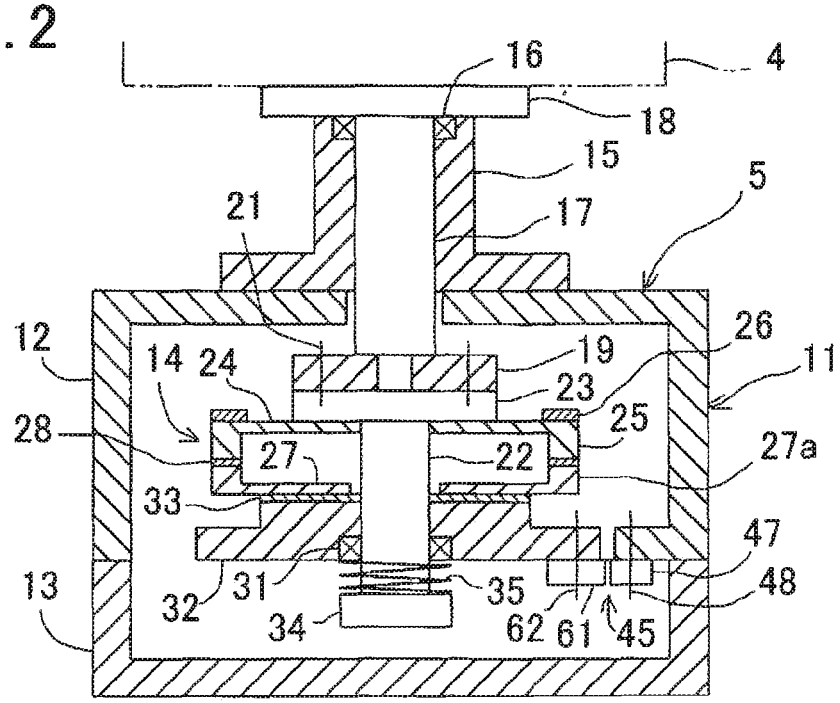
FIG. 2 is a cross-sectional view of a horizontal rotation driving unit of a surveying instrument according to the present embodiment.

It is to be noted that what are equivalent to components as shown in FIG. 2 are referred by the same symbol, and detailed description thereof will be omitted.

In a horizontal motor 14 (an ultrasonic motor) of the embodiment as described above, it is constituted so that a driving disk 24 (a vibration generating component 25) and an output shaft 22 are rotated integrally. In another embodiment, the driving disk 24 is fixed, and it is so arranged that an intermediate disk 27 is rotated integrally with an output flange 23 (the output shaft 22).

On a lower side of the output flange 23, the intermediate disk 27 is provided, and a second friction sheet 33 is interposed between the intermediate disk 27 and the output flange 23.

On a lower side of the intermediate disk 27, the driving disk 24 is provided, and further on a lower side of the driving disk 24, a fixed disk 32 is provided. Between the vibration generating component 25 and the fixed disk 32, a piezoelectric ceramic 26 is interposed.

By supplying power to the piezoelectric ceramic 26, the vibration generating component 25 is ultrasonically vibrated and a relative rotation is generated between the vibration generating component 25 and the intermediate disk 27.

Further, a friction torque T2 generated between the intermediate disk 27 and the output flange 23 is set smaller than a friction torque T1 generated between the driving disk 24 and the intermediate disk 27.

A whirl-stop unit 45 is provided between the fixed disk 32 and the motor casing 11 and a rotation of the fixed disk 32 is restricted. It is to be noted that, since the whirl-stop unit 45 is similar to the whirl-stop unit as described above, a description will be omitted.

In above mentioned another embodiment, the driving disk 24 and the fixed disk 32 function as a stator, and the intermediate disk 27 and the output flange 23 function as a rotor.

Next, when a voltage is applied to the piezoelectric ceramic 26, a relative rotation is generated between the driving disk 24 and the intermediate disk 27. Since the vibration generating component 25 is fixed to the motor casing 11 via the fixed disk 32 by the whirl-stop unit 45, the output shaft 22 is rotated.

Further, in a case where an overload is generated in the horizontal motor 14 or in a case where a rotation of the horizontal shaft 17 is restricted, a slip occurs between the output flange 23 and the intermediate disk 27 and a breakage of the horizontal motor 14 is prevented.

It is to be noted that, in the above mentioned embodiment, the horizontal motor 14 is provided on a lower end of a rotation shaft (the horizontal shaft 17) but it is needless to say that the horizontal motor 14 can be similarly provided on an upper end. Further, the ultrasonic motor (the horizontal motor 14) can be provided as a motor for rotating a telescope unit 6 around a horizontal axis 7 as the center.

Further, it is needless to say that the whirl-stop unit 45 can be put into practice for stopping a rotation of various devices which make a relative rotation with an eccentricity other than the embodiments as described above.

The invention claimed is:

1. An ultrasonic motor, which is an ultrasonic motor provided on a shaft end of a rotation shaft supported rotatably, wherein an output shaft of said ultrasonic motor is connected to said rotation shaft, a stator is rotatably provided on said output shaft, a rotor is fixed to said rotation shaft, a vibration generating component for generating an ultrasonic vibration is provided on either one of said rotor or said stator, said rotor and said stator are constituted to make a relative rotation by the ultrasonic vibration, a whirl-stop unit is provided between said stator and a fixed side for supporting said rotation shaft, wherein said whirl-stop unit has a joint holder provided on said fixed side and a connection element provided on said stator, wherein said joint holder has a ball holder for pressing a metal ball to said connection element by a compression spring in a circumferential direction and a connection pin holding said connection element between said ball holder and said connection pin, spanning over said joint holder and capable of tilting and wherein said whirl-stop unit restricts a displacement of said connection element in a rotating direction and absorbs a displacement in a radial direction between said joint holder and said connection element by tilting of said connection pin.

2. The ultrasonic motor according to claim 1, wherein said rotor has a driving disk, said vibration generating component in a ring shape is provided on an outer circumferential portion of said driving disk, said stator has an intermediate disk and a fixed disk, said intermediate disk is in close contact with said vibration generating component via a friction torque T1, said fixed disk is in close contact with said intermediate disk via a friction torque T2 smaller than said friction torque T1, and said whirl-stop unit is provided on said fixed disk.

3. The ultrasonic motor according to claim 1, wherein said rotor has an intermediate disk, said intermediate disk is in close contact with said output shaft via a friction torque T2, said stator has a driving disk and a fixed disk fixed to said driving disk, said driving disk has said vibration generating component in a ring shape on an outer circumferential portion, said vibration generating component is in close contact with said intermediate disk via a friction torque T1 larger than said friction torque T2, and said whirl-stop unit is provided on said fixed disk.

4. A surveying instrument comprising: a frame unit provided on a leveling unit, capable of horizontal rotation via a horizontal shaft and a telescope unit provided on said frame unit rotatably in a vertical direction via a vertical shaft, wherein an ultrasonic motor according to claim 1 is provided at least on either one of said horizontal shaft or said vertical shaft.

5. A surveying instrument comprising: a frame unit provided on a leveling unit, capable of horizontal rotation via a horizontal shaft and a telescope unit provided on said frame unit rotatably in a vertical direction via a vertical shaft, wherein an ultrasonic motor according to claim 2 is provided at least on either one of said horizontal shaft or said vertical shaft.

6. A surveying instrument comprising: a frame unit provided on a leveling unit, capable of horizontal rotation via a horizontal shaft and a telescope unit provided on said frame unit rotatably in a vertical direction via a vertical shaft, wherein an ultrasonic motor according to claim 3 is provided at least on either one of said horizontal shaft or said vertical shaft.

\* \* \* \* \*